(12) United States Patent
Hsu

(10) Patent No.: US 12,074,034 B2
(45) Date of Patent: Aug. 27, 2024

(54) ETCHANT COMPOSITIONS

(71) Applicant: Entegris, Inc., Billerica, MA (US)

(72) Inventor: Chia-Jung Hsu, Taipei (TW)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/480,844

(22) Filed: Sep. 21, 2021

(65) Prior Publication Data

US 2022/0093412 A1 Mar. 24, 2022

Related U.S. Application Data

(60) Provisional application No. 63/081,745, filed on Sep. 22, 2020.

(51) Int. Cl.
| | | |
|---|---|---|
| *H01L 21/3213* | (2006.01) | |
| *C09K 13/08* | (2006.01) | |
| *C11D 7/08* | (2006.01) | |
| *H01L 21/311* | (2006.01) | |

(52) U.S. Cl.
CPC ........ *H01L 21/32134* (2013.01); *C09K 13/08* (2013.01); *C11D 7/08* (2013.01); *H01L 21/31144* (2013.01); *C11D 2111/22* (2024.01)

(58) Field of Classification Search
CPC .... C09K 13/06; C09K 13/08; C11D 11/0047; C11D 17/0008; C11D 3/28; C11D 3/33; C11D 3/3445; C11D 3/3454; C11D 3/362; C11D 3/43; C11D 7/08; H01L 21/31144; H01L 21/32134

See application file for complete search history.

(56) References Cited

U.S. PATENT DOCUMENTS

| | | | |
|---|---|---|---|
| 6,323,169 B1 * | 11/2001 | Abe | G03F 7/423 |
| | | | 257/E21.255 |
| 9,256,134 B2 | 2/2016 | Minsek | |
| 10,428,271 B2 | 10/2019 | Cooper | |
| 2005/0239673 A1 * | 10/2005 | Hsu | C11D 3/3947 |
| | | | 257/E21.255 |
| 2008/0103078 A1 * | 5/2008 | Inaoka | G03F 7/425 |
| | | | 510/176 |
| 2009/0215658 A1 | 8/2009 | Minsek et al. | |
| 2016/0020087 A1 * | 1/2016 | Liu | C11D 3/2075 |
| | | | 510/175 |
| 2016/0130500 A1 * | 5/2016 | Chen | H01L 21/32134 |
| | | | 216/13 |
| 2016/0200975 A1 | 7/2016 | Cooper et al. | |
| 2016/0351388 A1 * | 12/2016 | Liu | C11D 7/34 |
| 2018/0251711 A1 | 9/2018 | Liu | |
| 2018/0291309 A1 * | 10/2018 | Frye | C11D 11/0047 |
| 2019/0276739 A1 * | 9/2019 | Liu | C09K 13/00 |
| 2020/0035485 A1 * | 1/2020 | Chen | H01L 21/02063 |

FOREIGN PATENT DOCUMENTS

| | | | | |
|---|---|---|---|---|
| CN | 101903988 B | 7/2013 | | |
| CN | 105612599 B | 5/2019 | | |
| EP | 3599634 A1 * | 1/2020 | ............... | B08B 3/04 |
| JP | 2009515055 A | 4/2009 | | |
| JP | 2010524208 A | 7/2010 | | |
| JP | 2016527707 A | 9/2016 | | |
| JP | 2019165225 A | 9/2019 | | |
| JP | 2020017732 A | 1/2020 | | |
| KR | 20100071136 A | 6/2010 | | |
| WO | 2016068182 A1 | 5/2016 | | |

* cited by examiner

*Primary Examiner* — Duy Vu N Deo
*Assistant Examiner* — Christopher Remavege

(57) ABSTRACT

Provided are compositions and methods for selectively etching hard mask layers and/or photoresist etch residues relative to low-k dielectric layers that are present. More specifically, the present invention relates to a composition and process for selectively etching titanium nitride and/or photoresist etch residues relative to low-k dielectric layers. Other materials that may be present on the microelectronic device should not be substantially removed or corroded by said compositions.

16 Claims, No Drawings

ETCHANT COMPOSITIONS

FIELD OF THE INVENTION

This invention relates to a composition and process for selectively etching titanium nitride and/or photoresist etch residues in the presence of other materials.

BACKGROUND OF THE INVENTION

Photoresist masks are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying low-k dielectric material. In other words, the removal chemistry is required to be highly selective to the metal hard mask relative to the low-k dielectric layer.

Accordingly, there exists a need for improved compositions for the selective removal of hard mask materials relative to low-k dielectric layers, as well as copper and aluminum oxide, which are present, while not compromising the etch rate of the hard mask.

SUMMARY OF THE INVENTION

In summary, the invention provides a composition and process for selectively etching titanium nitride and/or photoresist etch residues in the presence of other materials. In one aspect, the invention provides a composition comprising:
  a. a solvent composition comprising:
    i. water;
    ii. a water-miscible organic solvent;
    iii. N-methylmorpholine-N-oxide; and
    iv. dimethyl sulfone;
  b. an oxidizing agent;
  c. a chelating agent;
  d. a corrosion inhibitor;
  e. at least one etchant or at least one pH adjustor.

In other aspects, the invention provides methods for selectively etching hards mask layers and/or photoresist etch residues relative to low-k dielectric layers which are present on a microelectronic device.

DETAILED DESCRIPTION OF THE INVENTION

In general, the present invention relates to compositions and processes for selectively etching hard mask layers and/or photoresist etch residues relative to low-k dielectric layers that are present. More specifically, the present invention relates to a composition and process for selectively etching titanium nitride and/or photoresist etch residues relative to low-k dielectric layers. Other materials that may be present on the microelectronic device should not be substantially removed or corroded by said compositions.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g., 1 to 5 includes 1, 1.5, 2, 2.75, 3, 3.80, 4 and 5).

For ease of reference, the term "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, and/or a control and/or a test device.

"Hard mask capping layer" as used herein corresponds to materials deposited over dielectric material to protect same during the plasma etch step. Hard mask capping layers are traditionally silicon nitrides, silicon oxynitrides, titanium nitride, titanium oxynitride, titanium and other similar compounds.

As used herein, "titanium nitride" and "TiN$_x$" correspond to pure titanium nitride as well as impure titanium nitride including varying stoichiometries, and oxygen content (Ti-O$_x$N$_y$)

As defined herein, "low-k dielectric material" corresponds to any material used as a dielectric material in a layered microelectronic device, wherein the material has a dielectric constant less than about 3.5. In certain embodiments, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As used herein, the term "photoresist etch residues" corresponds to any residue comprising photoresist material, or material that is a by-product of photoresist subsequent to an etching or ashing step.

In a first aspect, the invention provides a composition comprising:
  a. a solvent composition comprising:
    i. water;
    ii. a water-miscible organic solvent;
    iii. N-methylmorpholine-N-oxide; and
    iv. dimethyl sulfone;

b. an oxidizing agent;
c. a chelating agent;
d. a corrosion inhibitor;
e. at least one etchant or pH adjustor.

In another embodiment, the invention either consists or consists essentially of the components a. through e. listed above.

The compositions of the invention are useful for selectively removing titanium nitride and/or photoresist etch residues. In one embodiment, the composition is a wet-etch solution which removes a metal hard mask and/or photoresist etch residues on a dielectric layer and is highly selective to the dielectric layer. In another embodiment, the composition is a wet-etch solution which removes a titanium nitride layer and/or photoresist etch residues that is highly selective to low-k dielectric materials.

In one embodiment, the pH of the composition ranges from about 5 to about 12.

In one embodiment, the oxidizing agents include, but are not limited to, hydrogen peroxide $H_2O_2$, $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), periodic acid, iodic acid, vanadium (V) oxide, vanadium (IV,V) oxide, ammonium vanadate, ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium biborate [$(NH_4)_2B_4O_7$], ammonium pentaborate [$(NH_4)B_5O_8$], or above borate compounds combined with hydrogen peroxide, ammonium perchlorate ($NH_4ClO_4$), ammonium periodate ($NH_4IO_4$), ammonium persulfate [$(NH_4)_2S_2O_8$], ammonium hypochlorite ($NH_4ClO$), ammonium tungstate [$(NH_4)_{10}H_2(W_2O_7)$], ammonium phosphate dibasic [$(NH_4)_2HPO_4$] combined with hydrogen peroxide, ammonium phosphate monobasic [$(NH_4)H_2PO_4$] combined with hydrogen peroxide, phosphoric acid combined with hydrogen peroxide, sodium polyatomic salts (e.g., sodium persulfate ($Na_2S_2O_8$), sodium hypochlorite (NaClO), sodium perborate), potassium polyatomic salts (e.g., potassium iodate ($KIO_3$), potassium permanganate ($KMnO_4$), potassium persulfate, nitric acid ($HNO_3$), potassium persulfate ($K_2S_2O_8$), potassium hypochlorite (KClO)), tetramethylammonium or tetraalkylammonium polyatomic salts (e.g., tetramethylammonium chlorite [$(N(CH_3)_4)ClO_2$], tetramethylammonium chlorate [$(N(CH_3)_4)ClO_3$], tetramethylammonium iodate [$(N(CH_3)_4)IO_3$], tetramethylammonium perborate [$(N(CH_3)_4)BO_3$], tetramethylammonium perchlorate [$(N(CH_3)_4)ClO_4$], tetramethylammonium periodate [$(N(CH_3)_4)IO_4$], tetramethylammonium persulfate [$(N(CH_3)_4)S_2O_8$], tetrabutylammonium peroxomonosulfate, peroxomonosulfuric acid, ferric nitrate [$Fe(NO_3)_3$], urea hydrogen peroxide [$(CO(NH_2)_2)H_2O_2$], percarboxylic acids such as performic acid [H(CO)OOH], peracetic acid [$CH_3(CO)$ OOH], perbutyric acid [$CH_3CH_2(CO)OOH$], perbenzoic acid, peroxytrifluoroacetic acid [$CF_3(CO)OOH$], or acetic acid, formic acid, trifluoroacetic acid, benzoic acid or their salts combined with hydrogen peroxide 1,4-benzoquinone, toluquinone, dimethyl-1,4-benzoquinone, chloranil, alloxan, N-methylmorpholine N-oxide, trimethylamine N-oxide, and combinations thereof. When the oxidizing agent is a salt it can be hydrated or anhydrous. The oxidizing agent may be introduced to the composition at the manufacturer, prior to introduction of the composition to the device wafer, or alternatively at the device wafer, i.e., in situ. In one embodiment, the oxidizing agent for the composition comprises hydrogen peroxide. In another embodiment, the oxidizing agent comprises hydrogen peroxide, hydrogen peroxide with strong base (e.g., TMAH, (2-hydroxyethyl) trimethylammonium hydroxide), ammonium iodate ($NH_4IO_3$), ammonium periodate ($NH_4IO_4$), ammonium phosphate dibasic [$(NH_4)_2HPO_4$], ammonium phosphate monobasic [$(NH_4)H_2PO_4$], or above one phosphates combined with hydrogen peroxide, peracetic acid [$CH_3(CO)OOH$], peroxytrifluoroacetic acid [$CF_3(CO)OOH$] performic acid [H(CO)OOH], peracetic acid [$CH_3(CO)OOH$], perbutyric acid [$CH_3CH_2(CO)OOH$], peroxytrifluoroacetic acid [$CF_3(CO)OOH$], or acetic acid, formic acid, trifluoroacetic acid combined with hydrogen peroxide. When the oxidizing agent comprises iodate or periodate, an iodine scavenger is preferably added to the removal composition. Although not wishing to be bound by theory, it is thought that as the iodate or periodate are reduced, iodine accumulates, which increases the rate of copper etch. Iodine scavengers include, but are not limited to, ketones more preferably ketones with hydrogen(s) alpha to the carbonyl such as 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, and combinations thereof. Preferably, the iodine scavenger includes 4-methyl-2-pentanone, 2,4-dimethyl-3-pentanone, or cyclohexanone.

Suitable etchants or pH adjustors include but are not limited to, HF, ammonium fluoride, tetrafluoroboric acid, hexafluorosilicic acid, other compounds containing B—F or Si—F bonds, tetrabutylammonium tetrafluoroborate (TBA-$BF_4$), tetraalkylammonium fluoride ($NR_1R_2R_3R_4F$), strong bases such as tetraalkylammonium hydroxide ($NR_1R_2R_3R_4OH$), where $R_1$, $R_2$, $R_3$, $R_4$ may be the same as or different from one another and is selected from the group consisting of hydrogen, straight-chained or branched $C_1$-$C_6$ alkyl groups (e.g., methyl, ethyl, propyl, butyl, pentyl, hexyl), $C_1$-$C_6$ alkoxy groups (e.g., hydroxyethyl, hydroxypropyl) substituted or unsubstituted aryl groups (e.g., benzyl), weak bases, and combinations thereof. In certain embodiments, the fluoride source comprises tetrafluoroboric acid, hexafluorosilicic acid, $H_2ZrF_6$, $H_2TiF_6$, $HPF_6$, ammonium fluoride, tetramethylammonium fluoride, ammonium hexafluorosilicate, ammonium hexafluorotitanate, or a combination of ammonium fluoride and tetramethylammonium fluoride. Alternatively, or in addition to fluoride sources, the etchant can comprise a strong base such as tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl) trimethylammonium hydroxide (choline hydroxide), (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), Triethylmethylammonium hydroxide, n-hexadecyltrimethylammonium hydroxide 1,1,3,3-tetramethylguanidine (TMG), guanidine carbonate, arginine, and combinations thereof. Weak bases contemplated include, but are not limited to, ammonium hydroxide, monoethanolamine (MEA), diethanolamine (DEA), triethanolamine (TEA), ethylenediamine, cysteine, and combinations thereof. In one embodiment, the etchant comprises a strong base such as TMAH, 1,1,3,3-tetramethylguanidine, (2-hydroxyethyl) trimethylammonium hydroxide, benzyltrimethylammonium hydroxide and combinations thereof. In one embodiment, the etchant is chosen from ammonium hydroxide and choline hydroxide.

In certain embodiments, to ensure wetting, especially when the pH is low, a surfactant can be added to the aqueous composition, advantageously an oxidation resistant, fluorinated anionic surfactant. Anionic surfactants contemplated in the compositions of the present invention include, but are not limited to, fluorosurfactants such as ZONYL® UR and ZONYL® FS-62 (DuPont Canada Inc., Mississauga, Ontario, Canada), and ammonium fluoroalkylsulfonates such as Novec™ (3M). In certain embodiments, when the etchant used comprises a fluoride, a long-chain tetraalkylammonium fluoride can be used as a surfactant as well as the etchant.

In one embodiment, the solvent composition referred to above may comprise:
(i) water;
(ii) at least one water-miscible organic solvent, or a combination thereof, wherein the at least one water-miscible organic solvent is chosen from methanol, ethanol, isopropanol, butanol, pentanol, hexanol, 2-ethyl-1-hexanol, heptanol, octanol, ethylene glycol, propylene glycol, butylene glycol, butylene carbonate, ethylene carbonate, propylene carbonate, dipropylene glycol, diethylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, dimethyl sulfoxide (DMSO), sulfolane, 4-methyl-2-pentanol, ethylene glycol monomethyl ether and diethylene glycol monomethyl ether, and combinations thereof. In certain embodiments, the solvent composition comprises water such as deionized water. In one embodiment, the water-miscible organic solvent comprises at least one species chosen from a glycol ether (e.g., diethylene glycol monomethyl ether, diethylene glycol monoethyl ether, diethylene glycol monobutyl ether), ethylene glycol monomethyl ether, DMSO, and combinations thereof. In another embodiment, the water-miscible organic solvent is a mixture of diethylene glycol monoethyl ether and diethylene glycol monobutyl ether;
(iii) N-methyl morpholine-N-oxide; and
(iv) dimethyl sulfone.

The compositions also comprise one or more chelating agents such as phosphonic acids such as nitrilotris(methylene)triphosphonic acid (e.g., Dequest 2000EG, Solutia, Inc., St. Louis, Mo.), 1-hydroxyethylidene-1,1-diphosphonic acid (HEDP), 1-hydroxyethane-1,1-diphosphonic acid, nitrilotris (methylenephosphonic acid) (NTMPA), N,N,N',N'-ethylenediaminetetra(methylenephosphonic)acid (EDTMP), 1,5,9-triazacyclododecane-N,N',N''-tris(methylenephosphonic acid) (DOTRP), trans-1,2-Diaminocyclohexane-N,N,N',N'-tetraacetic acid (CDTA), 1,4,7,10-tetraazacyclododecane-N, N',N'',N'''-tetrakis(methylenephosphonic acid) (DOTP), diethylenetriaminepenta(methylenephosphonic acid) (DETAP), aminotri(methylenephosphonic acid), bis(hexamethylene)triamine phosphonic acid, 1,4,7-triazacyclononane-N, N',N''-tris(methylenephosphonic acid) (NOTP), esters of phosphonic acids, phosphoric acids such as pyrophosphoric acid; their salts; and combinations thereof.

The compositions also comprise one or more corrosion inhibitors, which serve to prevent the corrosion or otherwise protect the copper surfaces on the microelectronic device. Such corrosion inhibitors include compounds such as 5-amino-1,3,4-thiadiazole-2-thiol (ATDT), benzotriazole (BTA), citric acid, oxalic acid, tannic acid, ethylenediaminetetraacetic acid (EDTA), uric acid, 1,2,4-triazole (TAZ), tolyltriazole, 5-methyl-1H-benzotriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, and benzothiazole, and combinations thereof.

In another embodiment, the composition may further comprise phosphoric acid, which serves to inhibit aluminum oxide corrosion.

Exemplary compositions include the following proportional ranges in weight percentages (=100%):

| Exemplary Composition | Deionized water | Etchant | 50% NMMO | Water-miscible organic solvent A | Water-miscible organic solvent B | Water-miscible organic solvent C | pH adjustor | Chelating agent |
|---|---|---|---|---|---|---|---|---|
| A | 50-70 | 0.1-1.5 | 0 | 1-30 | 1-30 | 1-30 | 6-10 | <1 |
| B | 25-45 | 0 | 1-30 | 1-30 | 1-30 | 1-30 | 0 | <1 |
| C | 25-45 | 0 | 1-30 | 1-30 | 1-30 | 1-30 | <1 | <1 |
| D | 30-50 | 1.5-2.5 | 1-30 | 1-30 | 1-30 | 1-30 | <1 | <1 |
| E | 30-50 | 0 | 1-30 | 1-30 | 1-30 | 1-30 | <1 | <1 |

All amounts are in weight percentage, based on overall composition=100%. These compositions can then be combined with an oxidizing agent. The target pH range is generally 5 to 12. In certain embodiments, the etchant or pH adjustor is chosen from tetramethylammonium hydroxide (TMAH), ammonium hydroxide, 1,1,3,3-tetramethylguanidine (TMG), tetraethylammonium hydroxide (TEAH), choline hydroxide, monoethanolamine, and triethanolamine.

In certain embodiments, the water miscible organic solvents A, B, and C are chosen from ethylene glycol, dimethyl sulfoxide (DMSO), diethylene glycol monobutyl ether, triethylene glycol monoethyl ether, diethylene glycol monoethyl ether, dipropylene glycol methyl ether (DPGME), and tripropylene glycol methyl ether (TPGME).

In certain embodiments, the chelating agent is chosen from ethylenediaminetetraacetic acid (EDTA), trans-1,2-Diaminocyclohexane-N,N,N',N'-tetraacetic acid, 1-hydroxyethylidene-1,1-diphosphonic acid (HEDP), 1-hydroxyethane-1,1-diphosphonic acid, N,N,N',N'-ethylenediaminetetra(methhylenephosphonic)acid, nitrilotris(methylene)triphosphonic acid, and nitrilotris(methylenephosphonic acid) (NTMPA).

*NMMO is 4-methylmorpholine N-oxide (CAS No. 7529-22-8)

It will be appreciated that it is common practice to make concentrated forms of the composition to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted composition by the manufacturer before use and/or during use at the fab.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, in a further aspect, the invention provides a kit comprising, in one or more containers, one or more components adapted to form the compositions described herein. The containers of the kit must be suitable for storing and shipping said removal composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, can be used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (i.e., additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mm (0.005 inch) to about 30 mm (0.030 inch), as for example a thickness of 20 mm (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

This invention can be further illustrated by the following examples of preferred embodiments thereof, although it will be understood that these examples are included merely for purposes of illustration and are not intended to limit the scope of the invention unless otherwise specifically indicated.

Experimental Section

The following compositions were formulated and tested on titanium nitride, $Al_{ox}$, and Cu test wafers.

| Comp. No. | DI water | 46.8% Choline | 29% $NH_4OH$ | 50% NMMO | Sulfolane | Butyl Carbitol | Ethyl Carbitol | 60% *$H_3PO_4$ | AAc | CDTA | $pH^1$ | $pH^2$ |
|---|---|---|---|---|---|---|---|---|---|---|---|---|
| 1 | 60.55 | 1 | | | 10 | 10 | 10 | | 8.33 | 0.12 | 8.27 | 7.58 |
| 2 | 34.88 | | | 20 | 25 | 20 | | | | 0.12 | 7.60 | 6.28 |
| 3 | 34.88 | | | 20 | 25 | 20 | | 0.5 | | 0.12 | 6.83 | 5.39 |

| Comp. No. | DI water | 46.8% Choline | 29% NH₄OH | 50% NMMO | Sulfolane | Butyl Carbitol | Ethyl Carbitol | *H₃PO₄ | 60% AAc | CDTA | pH¹ | pH² |
|---|---|---|---|---|---|---|---|---|---|---|---|---|
| 4 | 42.38 | 2 | | 20 | 15 | 20 | | 0.5 | | 0.12 | 8.61 | 6.89 |
| 5 | 44.28 | | 0.1 | 20 | 15 | 20 | | 0.5 | | 0.12 | 6.55 | 5.58 |

AAc = Ammonium acetate
*H₃PO₄ is 85%

All amounts are in weight percentage, based on overall composition=100%. These compositions were combined with 31% H₂O₂ on a 1:1 basis (weight:weight). The values for pH¹ were for the composition prior to mixing with H₂O₂ and pH² was measured after mixing with H₂O₂. These compositions as mixed were used in experiments in a Teflon beaker at 59° C. on test wafers as shown below:

| Composition No. | Average etch rate (Å per min) on Titanium Nitride standard wafer | Average etch rate (Å per min) on Aluminum Oxide standard wafer |
|---|---|---|
| 1 | 294 | 17 |
| 2 | 92 | 11.3 |
| 3 | 64 | 1.9 |
| 4 | 118 | 2.5 |
| 5 | 100 | 2.2 |

| Composition No. | Deionized water mL | 46.8% Choline | 29% NH₄OH | 50% NMMO | DMSO | DMSO₂ | Butyl Carbitol | Ethyl Carbitol | *H₃PO₄ | EDTMP | CDTA | pH¹ | pH² |
|---|---|---|---|---|---|---|---|---|---|---|---|---|---|
| 6 | 74.13 | 0.5 | | 10 | | 5 | 10 | | 0.25 | | 0.12 | 8.88 | 7.72 |
| 7 | 74.13 | 0.5 | | 10 | | 5 | 10 | | 0.25 | 0.12 | | 8.70 | 7.50 |
| 8 | 73.75 | 0.5 | | 10 | 5 | | 10 | | 0.25 | | 0.5 | 6.57 | 5.91 |
| 9 | 73.75 | 0.5 | | 10 | 5 | | 10 | | 0.25 | 0.5 | | 6.87 | 5.97 |

*H₃PO₄ is 85% aqueous

All amounts are in weight percentage, based on overall composition=100%. These compositions were combined with 31% H₂O₂ on a 1:1 basis (weight:weight). The values for pH¹ were for the composition prior to mixing with H₂O₂ and pH² was measured after mixing with H₂O₂. These compositions as mixed were used in experiments in a Teflon beaker at 59° C. on test wafers as shown below:

| Composition No. | Average etch rate (Å per min) on Titanium Nitride standard wafer | Average etch rate (Å per min) on Aluminum Oxide standard wafer | Average etch rate (Å per min) on Cu wafer |
|---|---|---|---|
| 6 | 251 | 15.1 | |
| 7 | 237 | 2.9 | |
| 8 | 123 | 0.7 | 64.0 |
| 9 | 149 | 0.3 | 36.6 |

| Composition No. | Deionized water | 46.8 wt % Choline | 29 wt % NH₄OH | 50 wt % NMMO | DMSO₂ | Butyl Carbitol | Ethyl Carbitol | *H₃PO₄ | EDTMP | **BTA | pH¹ | pH² |
|---|---|---|---|---|---|---|---|---|---|---|---|---|
| 10 | 73.95 | 0.5 | | 10 | 5 | 10 | | 0.25 | 0.3 | | 7.43 | 6.38 |
| 11 | 73.05 | 0.5 | | 10 | 5 | 10 | | 0.25 | 0.3 | 0.9 | 6.93 | 5.94 |

*H₃PO₄ is 85% aqueous
**BTA = benzotriazole

All amounts are in weight percentage, based on overall composition=100%. These compositions were combined with 31% $H_2O_2$ on a 1:1 basis (weight:weight). The values for $pH^1$ were for the composition prior to mixing with $H_2O_2$ and $pH^2$ was measured after mixing with $H_2O_2$. These compositions as mixed were used in experiments in a Teflon beaker at 59° C. on test wafers as shown below:

| Composition No. | Average etch rate (Å per min) on Titanium Nitride standard wafer | Average etch rate (Å per min) on Aluminum Oxide standard wafer | Average etch rate (Å per min) on Cu wafer |
| --- | --- | --- | --- |
| 10 | 169 | 15.1 | 20.2 |
| 11 | 159 | 2.9 | 2.1 |

| Composition No. | Deionized water mL | Etchant/ pH adjustor | 50 wt % NMMO solution | DMSO$_2$ | Butyl Carbitol | Ethyl Carbitol | 85 wt % H$_3$PO$_4$ | EDTMP | Cu inhibitor |
| --- | --- | --- | --- | --- | --- | --- | --- | --- | --- |
| 12 | 63.05 | 0.5 (29% NH$_4$OH) | 10 | | 10 | 10 | 0.25 | 0.3 | 0.9 BTA |
| 13 | 61.24 | 2.5 (44.1% choline) | 10 | | 10 | 10 | — | 0.5 | 0.9 BTA |

All amounts are in weight percentage, based on overall composition=100%. These compositions are combined with 31% $H_2O_2$ on a 1:1 basis (weight:weight).

Legend:
NMMO=4-methylmorpholine N-oxide (CAS No. 7529-22-80)
DMSO$_2$=dimethyl sulfone
EDTMP=ethylene diamine tetra(methylene phosphonic acid)
CDTA=trans-1,2-Diaminocyclohexane-N,N,N',N'-tetraacetic acid (CAS No. 125572-95-4)
*H$_3$PO$_4$ is 85% aqueous
**BTA=benzotriazole
Butyl carbitol, diethylene glycol monobutyl ether (CAS No. 112-34-5)
Ethyl carbitol, diethylene glycol monoethyl ether (CAS No. 111-90-0)

All amounts are in weight percentage, based on overall composition=100%. These compositions were combined with 31% $H_2O_2$ on a 1:1 basis (weight:weight). The values for $pH^1$ were for the composition prior to mixing with $H_2O_2$ and $pH^2$ was measured after mixing with $H_2O_2$. These compositions as mixed were used in experiments in a Teflon beaker at 59° C. on test wafers as shown below:

| Example | Mixing preparation | Temperature | Original pH | POU | Titanium nitride (etch rate; 500 Å for 2 minutes) | Aluminum oxide (etch rate; 200 Å for 10 minutes) | Copper (etch rate; 3 KA for 10 minutes) |
| --- | --- | --- | --- | --- | --- | --- | --- |
| 12 | 31% H$_2$O$_2$ | 59° C. | 7.58 | 7.46 | 191 | 0.4 | 2.1 |
| 13 | 31% H$_2$O$_2$ | 59° C. | 8.43 | 6.47 | 142 | 0.2 | 1.5 |

Legend:
POU=point of use
ERSTD[1]=etch rate standard wafer (internal standard) titanium nitride; value is the average etch rate for a 500 Å wafer for 2 minutes
aluminum oxide standard wafer −200 Å for 2 minutes
ERSTD[2]=etch rate standard wafer The invention has been described in detail with particular reference to certain embodiments thereof, but it will be understood that variations and modifications can be effected within the spirit and scope of the invention.

The invention claimed is:

1. A composition comprising:
   a. a solvent mixture comprising:
      i. water;
      ii. a water-miscible organic solvent;
      iii. N-methylmorpholine-N-oxide, comprising about 2.5 to about 5 wt. % of the composition; and
      iv. dimethyl sulfone;
   b. an oxidizing agent, comprising about 15 wt. % of the composition;
   c. a chelating agent;
   d. a corrosion inhibitor, comprising phosphoric acid; and
   e. at least one etchant or pH adjustor,
   wherein the composition has a pH of about 5 to about 12.

2. The composition of claim 1, wherein the water-miscible solvent is chosen from diethylene glycol monobutyl ether and diethylene glycol monoethyl ether or a mixture thereof.

3. The composition of claim 1, wherein the oxidizing agent is hydrogen peroxide.

4. The composition of claim 1, wherein the etchant or pH adjustor is chosen from choline hydroxide and ammonium hydroxide.

5. The composition of claim 1, wherein the etchant or pH adjustor is ammonium hydroxide.

6. The composition of claim 1, further comprising a surfactant.

7. A method for removing titanium nitride and/or photoresist etch residue from a microelectronic device, which comprises contacting said device with the composition of claim 1.

8. A kit including, in one or more containers, one or more components a. through e., as claimed in claim 1.

9. The composition of claim 1, wherein the phosphoric acid comprises about 0.1 to about 1 wt. % of the composition.

10. The composition of claim 1, wherein water comprises about 35 to about 80 wt. % of the composition.

11. The composition of claim 1, wherein one or more water-miscible organic solvents comprise about 5 to about 20 wt. % of the composition.

12. The composition of claim 1, wherein dimethyl sulfone comprises about 5 to about 25 wt. % of the composition.

13. The composition of claim 1, wherein the composition has an aluminum oxide etch rate of about 0.4 angstroms per 10 minutes or less.

14. The composition of claim 13, wherein the composition has a copper etch rate of about 2.1 angstroms per 10 minutes or less.

15. The composition of claim 14, wherein the composition has a titanium nitride etch rate of about 191 angstroms per 2 minutes or greater.

16. The composition of claim 1, wherein the composition has an aluminum oxide etch rate of about 0.2 angstroms per 10 minutes and a titanium nitride etch rate of about 142 angstroms per 2 minutes or greater.

* * * * *